(12) United States Patent
Minamide et al.

(10) Patent No.: US 9,241,436 B2
(45) Date of Patent: Jan. 19, 2016

(54) COMPONENT MOUNTING DEVICE, A COMPONENT MOUNTING METHOD, AN IMAGING DEVICE AND AN IMAGING METHOD

(75) Inventors: Yuki Minamide, Yamanashi (JP); Hirotake Nakayama, Yamanashi (JP); Kimiaki Sano, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 689 days.

(21) Appl. No.: 13/579,752

(22) PCT Filed: Oct. 13, 2011

(86) PCT No.: PCT/JP2011/005745
§ 371 (c)(1),
(2), (4) Date: Aug. 17, 2012

(87) PCT Pub. No.: WO2012/117466
PCT Pub. Date: Sep. 7, 2012

(65) Prior Publication Data
US 2013/0162808 A1    Jun. 27, 2013

(30) Foreign Application Priority Data

Mar. 2, 2011 (JP) ................................ 2011-044644
Mar. 2, 2011 (JP) ................................ 2011-044645

(51) Int. Cl.
H04N 7/18      (2006.01)
H04N 13/04     (2006.01)
H05K 13/04     (2006.01)

(52) U.S. Cl.
CPC ............. *H05K 13/0413* (2013.01); *H04N 7/18* (2013.01)

(58) Field of Classification Search
CPC .............................. H05K 13/0413; H04N 7/18
See application file for complete search history.

(56) References Cited

U.S. PATENT DOCUMENTS 6,606,788 B1     8/2003   Morimoto et al.
2002/0136443 A1* 9/2002   Chi et al. .................. 382/151

FOREIGN PATENT DOCUMENTS

CN    1292208 A    4/2001
CN    1585599 A    2/2005
(Continued)

OTHER PUBLICATIONS

International Search Report for PCT/JP2011/005745 dated Nov. 15, 2011.

(Continued)

*Primary Examiner* — Michael Teitelbaum
(74) *Attorney, Agent, or Firm* — Pearne & Gordon LLP

(57) ABSTRACT

A first illuminating devices, when the component adsorbed by an adsorbing nozzle and located in an imaging field of vision is a surface mounted component, illuminate the bottom surface of a component by irradiating light to the component obliquely from below, and a second illuminating device, when the component adsorbed by the adsorbing nozzle and located in the imaging field of vision is a through hole component, only illuminate the downwards extending parts of the component by irradiating light at an irradiation angle closer to a horizontal direction irradiation than the irradiation angle of the light of the first illuminating device to the component are included. That the component is illuminated by the first illuminating devices and that the component is illuminated by the second illuminating devices are switched based on whether the component is a surface mounted component or a through hole component.

6 Claims, 11 Drawing Sheets

(56) References Cited

FOREIGN PATENT DOCUMENTS

| | | | |
|---|---|---|---|
| JP | 09-178445 A | | 7/1997 |
| JP | 10-332331 A | | 12/1998 |
| JP | 2003-8300 | * | 1/2003 |
| JP | 2009-302147 A | | 12/2009 |
| JP | 4576062 B2 | | 8/2010 |

OTHER PUBLICATIONS

Chinese Office action for Application No. 201180011048.7 dated Apr. 30, 2015.

Chinese Search Report for Application No. 201180011048.7 dated Apr. 30, 2015.

* cited by examiner

COMPONENT MOUNTING DEVICE, A COMPONENT MOUNTING METHOD, AN IMAGING DEVICE AND AN IMAGING METHOD

TECHNICAL FIELD

The invention relates to a component mounting device which mounts a component on a board by moving an adsorbing nozzle which adsorbs the component and a component mounting method thereof, and an imaging device which is included in the component mounting device and images the board which is adsorbed by the adsorbing nozzle and an imaging method thereof.

BACKGROUND ART

A component mounting device mounts a component on a board which is positioned by a board positioning unit such as a conveyor by making an adsorbing nozzle which adsorbs the component to move. The component mounting device includes an imaging device (imaging unit) which images the component adsorbed by the adsorbing nozzle from below, and grasps the posture of the component by recognizing the component based on an obtained image. Because of the above structure, the component mounting device can precisely mount the component at a predetermined position on the board with a predetermined posture.

When the component is a surface mounted component which is to be surface mounted on the surface of the board, the bottom surface of the component is illuminated by an illuminating device which irradiates light obliquely from below the component and the component is imaged. The positions of the electrode parts of the component are recognized so that the posture of the component is grasped. The surface mounted component includes, for example, chip components such as a chip register or a chip condenser other than a component which has electrode parts which have a bended shape to contact with the surface of the board. When the component is a through hole component which has downwards extending parts which extend downward, only the downwards extending parts are illuminated by an illuminating device which irradiates light in a direction (horizontal direction) orthogonal to the longitudinal direction of the downwards extending parts, the component is imaged and the position of the through hole component is recognized (for example, patent document 1). For example, the downwards extending parts of the through hole component are parts extending below the component such as electrode parts or inserters that have a straight shape to be inserted in the thickness direction of the board.

RELATED ART DOCUMENT

Patent Document

Patent document 1: Japan Patent Publication No. 4576062

SUMMARY OF THE INVENTION

Problems to be Solved by the Invention

However, in the component mounting device in which the imaging device includes the illuminating device which irradiates light in a horizontal direction, a component located above the imaging device cannot be illuminated. Therefore, to illuminate the downwards extending parts of the through hole component and to make these parts to be imaged by the imaging device, it is necessary to make the adsorbing nozzle which adsorbs the component to drop so that the downwards extending parts is moved into the inside of the imaging device. However, if the adsorbing nozzle are made to drop, there are problems that the time required for the imaging of components increases, mounting tacts increase, and the productivity of the board decreases.

Thus, an object of the present invention is to provide a component mounting device, a component mounting method, an imaging device and an imaging method so that the imaging of through hole components can be performed in a short time and the increase of the mounting tact of the component mounting device can be prevented.

Means for Solving the Problems

As one aspect of this invention, an imaging device which is included in a component mounting device that mounts a component on a board by making an adsorbing nozzle which adsorbs the component to move, and which images from below the component which is adsorbed by the adsorbing nozzle when the adsorbing nozzle is moved so that the component is located in an imaging field of vision, comprise a first illuminating unit which, when the component which is adsorbed by the adsorbing nozzle and is located in the imaging field of vision is a surface mounted component which is to be surface mounted on the surface of the board, illuminates the bottom surface of the surface mounted component by irradiating light obliquely from below to the surface mounted component, a second illuminating unit which, when the component which is adsorbed by the adsorbing nozzle and is located in the imaging field of vision is a through hole component which has downwards extending parts which extend downward, only illuminates the downwards extending parts of the through hole component by irradiating light at an irradiation angle that is closer to a horizontal direction irradiation than the irradiation angle of the light of the first illuminating unit to the through hole component, an illumination switching unit which switches between that the component is illuminated by the first illuminating unit and that the component is illuminated by the second illuminating unit based on whether the component adsorbed by the adsorbing nozzle is a surface mounted component or a through hole component, and an imaging performing unit which images the component illuminated by the first illuminating unit or the second illuminating unit.

In the imaging device, the component is imaged at the same imaging height in the imaging field of vision irrespective of whether the component which is adsorbed by the adsorbing nozzle is a surface mounted component or a through hole component.

In the imaging device, the light irradiated from the first illuminating unit comprises scattered light, and the light irradiated from the second illuminating unit comprises parallel light or convergent light.

In the imaging device, the second illuminating unit is provided at a position that is higher than the first illuminating unit. As one aspect of this invention, an imaging method with an imaging device which is included in a component mounting device that mounts a component on a board by making an adsorbing nozzle which adsorbs the component to move, comprises a first illuminating unit which, when the component which is adsorbed by the adsorbing nozzle and is located in an imaging field of vision is a surface mounted component which is to be surface mounted on the surface of the board, illuminates the the bottom surface of the surface mounted component by irradiating light obliquely from below to the surface mounted component, and a second illuminating unit which, when the component which is adsorbed by the adsorbing nozzle and is located in the imaging field of vision is a through hole component which has downwards extending parts which extend downward, only illuminates the downwards extending parts of the through hole component by irradiating light at an irradiation angle that is closer to a horizontal direction irradiation than the irradiation angle of the light of the first illuminating unit to the through hole component, and images the component from below which is adsorbed by the adsorbing nozzle when the adsorbing nozzle is moved so that the component is located in the imaging field of vision, comprising an illumination switching procedure which switches between that the component is illuminated by the first illuminating unit and that the component is illuminated by the second illuminating unit based on whether the component adsorbed by the adsorbing nozzle is a surface mounted component or a through hole component, and an imaging performing procedure which images the component illuminated by the first illuminating unit or the second illuminating unit.

In the imaging method, the component is imaged at the same imaging height in the imaging field of vision irrespective of whether the component which is adsorbed by the adsorbing nozzle is a surface mounted component or a through hole component.

In the imaging method, the light irradiated from the first illuminating unit comprises scattered light, and the light irradiated from the second illuminating unit comprises parallel light or convergent light.

In the imaging method, the second illuminating unit is provided at a position that is higher than the first illuminating unit.

As one aspect of this invention, a component mounting device, comprises a board positioning unit which positions a board, a component supplying unit which supplies a component, an adsorbing nozzle which adsorbs the component supplied from the component supplying unit, an imaging unit which, when the component which is adsorbed by the adsorbing nozzle and is moved into an imaging field of vision is a surface mounted component which is to be surface mounted on the surface of the board, images the surface mounted component from below by illuminating the bottom surface of the surface mounted component with a first illuminating unit which irradiates light obliquely from below to the surface mounted component, and when the component which is adsorbed by the adsorbing nozzle and is moved into the imaging field of vision is a through hole component which has downwards extending parts that extend downwards, images the through hole component from below by only illuminating the downwards extending parts with a second illuminating unit which irradiates light at an irradiation angle which is closer to a horizontal direction irradiation than the irradiation angle of the light of the first illuminating unit to the through hole component, and a mounting control unit which, after the component is imaged by the imaging unit, grasps the posture of the component based on an image obtained through the imaging, and mounts the component on the board which is positioned by the board positioning unit based on the grasped posture.

As one aspect of this invention, a component mounting method of a component mounting device which comprises a board positioning unit which positions a board, a component supplying unit which supplies a component, an adsorbing nozzle which adsorbs the component supplied from the component supplying unit, and an imaging unit which images the component from below, wherein the component mounting method comprises a procedure in which the imaging unit, when the component which is adsorbed by the adsorbing nozzle and is moved into an imaging field of vision of the imaging unit is a surface mounted component which is to be surface mounted on the surface of the board, imaging the surface mounted component from below by illuminating the bottom surface of the surface mounted component with a first illuminating unit which irradiates light obliquely from below to the surface mounted component, and when the component which is adsorbed by the adsorbing nozzle and is moved into the imaging field of vision of the imaging unit is a through hole component which has downwards extending parts that extend downwards, images the through hole component from below by only illuminating the downwards extending parts with a second illuminating unit which irradiates light at an irradiation angle which is closer to a horizontal direction irradiation than the irradiation angle of the light of the first illuminating unit to the through hole component, and a procedure in which the posture of the component is grasped based on an image obtained after the imaging unit images the component, and the component is mounted on the board which is positioned by the board positioning unit based on the grasped pasture.

Effect of the Invention in the present invention, the imaging unit or the imaging device, besides the first illuminating unit which illuminates the bottom surface of the surface mounted component by irradiating light obliquely from below to the surface mounted component located in the imaging field of vision, further includes the second illuminating unit which irradiates light at an irradiation angle that is closer to a horizontal direction irradiation than the irradiation angle of the light of the first illuminating unit (in other words, not the horizontal direction irradiation) as an illuminating unit to only illuminate the downwards extending parts of the through hole component located in the imaging field of vision. In the present invention, both when the component is illuminated by the first illuminating unit and when the component is illuminated by the second illuminating unit, the imaging region of the component can be set to be located above the imaging device, and irrespective of whether the component which is adsorbed by the adsorbing nozzle is a surface mounted component or a through hole component, the component can be imaged at the same height in the imaging field of vision. Therefore, in the present invention, when the through hole component which is adsorbed is located in the imaging field of vision of the imaging device, it is not necessary to make the adsorbing nozzle drop once the horizontal movement of the adsorbing nozzle stops as before. The time required for the imaging of through hole components is shortened and the increase of the mounting tact of the component mounting device can be prevented. Further, in the present invention, the first illuminating unit used when a surface mounted component is imaged and the second illuminating unit used when a through hole component is imaged can be provided side by side, and the through hole component can be imaged at the same imaging height as that at which the surface mounted component is imaged. Therefore, in the present invention, irrespective of whether the component is a surface mounted component or a through hole component, the operation of the adsorbing nozzle when the component is imaged can be performed constantly.

EMBODIMENTS OF THE INVENTION

Figure 1:
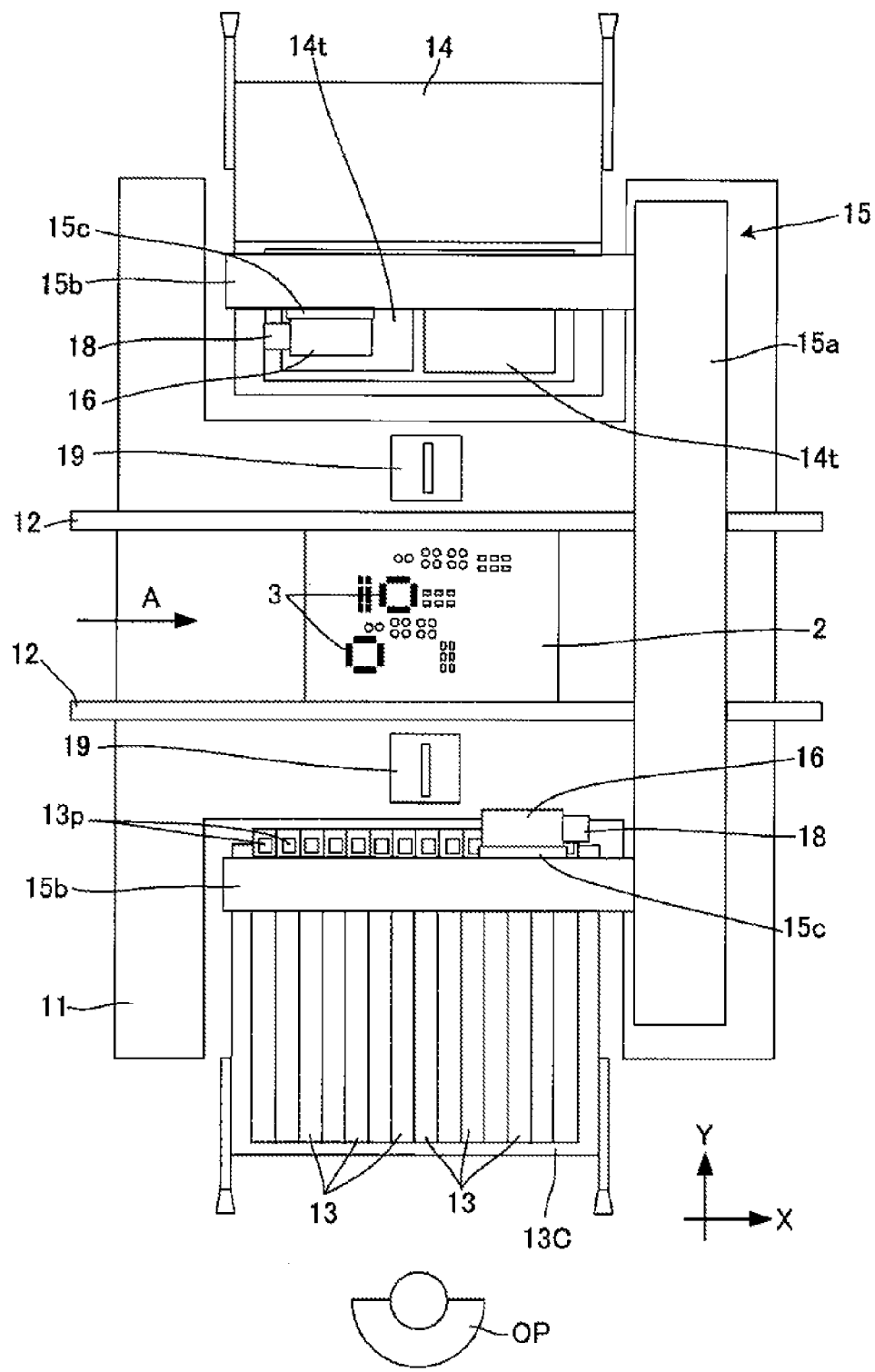
FIG. 1 is a plan view of a component mounting device in one embodiment of the present invention.
Figure 2:
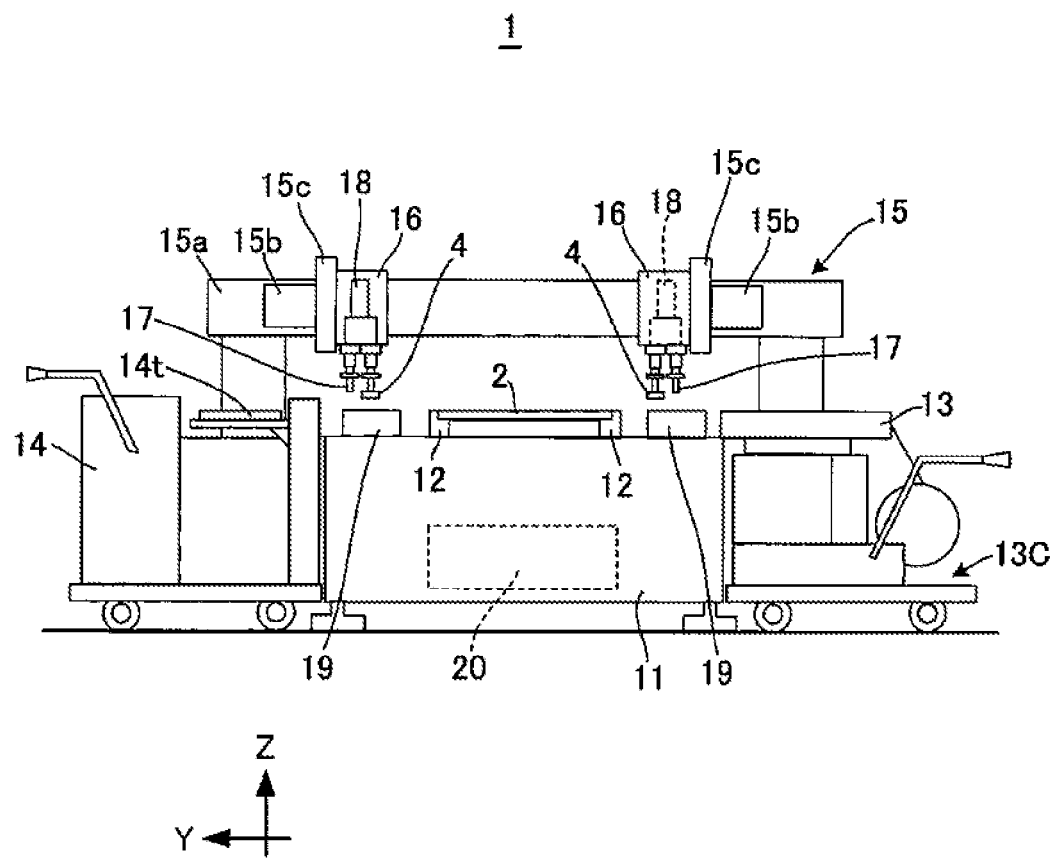
FIG. 2 is a side view of the component mounting device in the embodiment of the present invention.

Below, an embodiment of the invention is described with reference to the figures. A component mounting device 1 shown in FIGS. 1 and 2 is a device which repeatedly performs a series of actions which include importing and positioning a board 2, mounting a component 4 to electrodes 3 on the positioned board 2 and exporting the board 2 on which the component 4 is mounted. In the present embodiment, the direction of conveying the board 2 (arrow A show in FIG. 1) in the component mounting device 1 is assumed as an X axis direction, the direction in the horizontal plane perpendicular to the X axis direction is assumed as a Y axis direction (front and back direction), and the up and down direction is assumed as a Z axis direction. In the Y axis direction (front and back direction), a side (the bottom side of the paper in FIG. 1) where an operator OP is usually located before the component mounting device 1 is assumed as a front side, and the other side is assumed as a rear side.

In FIGS. 1 and 2, the component mounting device 1 includes a conveyor 12, a plurality of tape feeders 13 and a tray feeder 14, a head moving robot 15, two mounting heads 16, adsorbing nozzles 17, board cameras 18 and two component cameras 19. The conveyor 12 is provided on a base 11 and is a board positioning unit for conveying the board 2 and positioning the board 2 to a predetermined operation position (a position shown in FIG. 1). The tape feeders 13 and the tray feeder 14 are component supplying unit for supplying the component 4. The head moving robot 15 is an X-Y coordinate system type robot and is provided on the base 11. The two mounting heads 16 are moved in a horizontal plane by the head moving robot 15. Each of the adsorbing nozzles 17 is provided rotatably and movably in the vertical direction in each of the mounting heads 16, and adsorbs the component 4 which is supplied from the tape feeders 13 and the tray feeder 14. Each of the board cameras 18 is provided in each of the mounting heads 16. The two component cameras 19 (imaging devices) are provided in two positions at both sides of the conveyor 12 on the base 11.

In FIGS. 1 and 2, the conveyor 12 includes a pair of belt conveyors which extend in the X axis direction on the base 11. The conveyor 12 conveys the board 2 in the X axis direction with two ends of the board 2 in the Y axis direction supported from below.

In FIGS. 1 and 2, the plurality of tape feeders 13 are provided on a carriage 13C which is attached to the front side of the base 11 by an operator OP. The tape feeders 13 continually supply components 4 to component supply ports 13p which are provided at the end of the central part of the base 11. The tray feeder 14 is attached to the rear side of the base 11 by the operator OP. The tray feeder 14 supplies the component 4 with trays 14t that contain the component 4.

Figure 3:
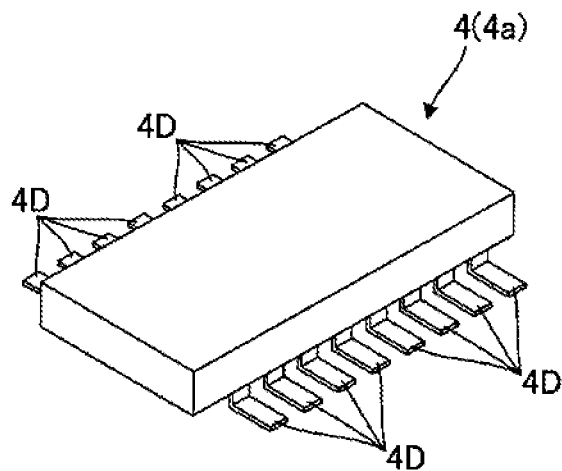
FIG. 3(a) is a perspective view of a surface mounted component which is to be mounted on a board by the component mounting device in the embodiment of the present invention.
FIG. 3(b) is a perspective view of a through hole component which is to be mounted on a board by the component mounting device in the embodiment of the present invention.
Figure 3:
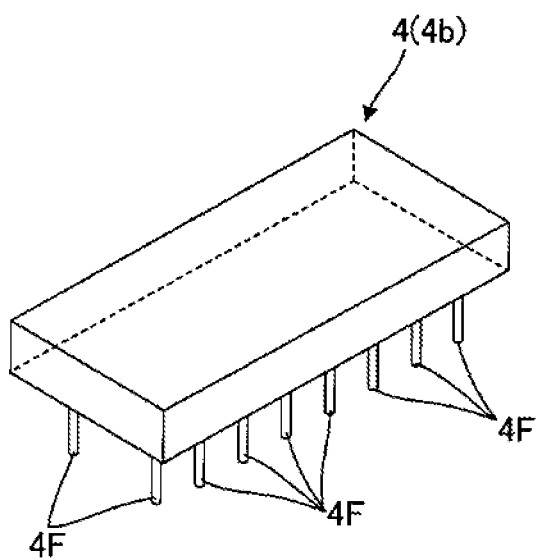

In the present embodiment, the component 4 that each of the tape feeders 13 supplies is, for example, as shown in FIG. 3 (a), a surface mounted component 4a which has a plurality of (here, 16) electrode parts 4D which have a bended shape to contact with the surface of the board 2. The component 4 that the tray feeder 14 supplies is, for example, as shown in FIG. 3 (b), a through hole component 4b which has a plurality of (here, 16) downwards extending parts 4F which extend downwards and have a straight shape to be attached to the board 2 by being inserted into the board 2.

In FIGS. 1 and 2, the head moving robot 15 includes a Y axis table 15a which is provided to extend in the Y axis direction above the conveyor 12, two X axis tables 15b which extend in the X axis direction and are provided on the Y axis table 15a to be movable in the Y axis direction, and two moving stages 15c which are respectively provided on the two X axis table 15b to be movable in the X axis direction.

The moving stages 15c are respectively attached to the two mounting heads 16, and horizontally move above the base 11 with the movement of the head moving robot 15, namely, a combination of the movement of the X axis tables 15b relative to the Y axis table 15a and the movement of the moving stages 15c relative to the X axis tables 15b.

In FIGS. 1 and 2, the adsorbing nozzle 17 which is provided in each of the mounting head 16 picks up the component 4 by vacuum-adsorbing the component 4 which is supplied from the tape feeder 13 or the tray feeder 14, releases the vacuum adsorption of the component 4 at a predetermined site (component mounting site) on the board 2 which is positioned by the conveyor 12, and makes the component 4 to be separated from the adsorbing nozzle 17. In this way, the adsorbing nozzle 17 mounts the component 4 onto the board 2.

In FIGS. 1 and 2, each of the board cameras 18 turns downwards to an imaging field of vision, and images from above a board mark (not shown in the figures) that is a mark for sensing the position of the board 2 which is provided on the board 2 when the board 2 is positioned at an operation position by the conveyor 12.

In FIGS. 1 and 2, each of the component cameras 19 turns upwards to an imaging field of vision, and images from below the component 4 which is adsorbed by the mounting head 16 and positioned by the movement of the mounting head 16 to the imaging field of vision.

A control device 20 (FIGS. 2 and 4) which the component mounting device 1 includes controls the operation of a conveyor driving mechanism 21 (FIG. 4) including an actuator which is not shown in the figure so that the board 2 is conveyed and positioned to the operation position by the conveyor 12.

The control device 20 controls the operation of a tape feeder driving mechanism 22 (FIG. 4) including an actuator which is not shown in the figure so that the component 4 is supplied to the component supply port 13p by the tape feeder 13. The control device 20 controls the operation of a tray feeder driving mechanism 23 (FIG. 4) including an actuator which is not shown in the figure so that the component 4 is supplied by the tray feeder 14.

The control device 20 controls the operation of a robot driving mechanism 24 (FIG. 4) that makes the head moving robot 15 to actuate so that each of the mounting head 16 is moved in a direction in the horizontal plane.

The control device 20 controls the operation of a nozzle driving mechanism 25 (FIG. 4) including an actuator which is not shown in the figure so that the adsorbing nozzle 17 moves vertically and rotatively relative to the mounting head 16. The control device 20 supplies a vacuum pressure to the absorbing nozzle 17 and releases the supply of the vacuum pressure by controlling the operation of an adsorbing mechanism 26 (FIG. 4) including an actuator which is not shown in the figure so that the component 4 is adsorbed (picked up) and un-adsorbed (separated) by the adsorbing nozzle 17.

Figure 4:
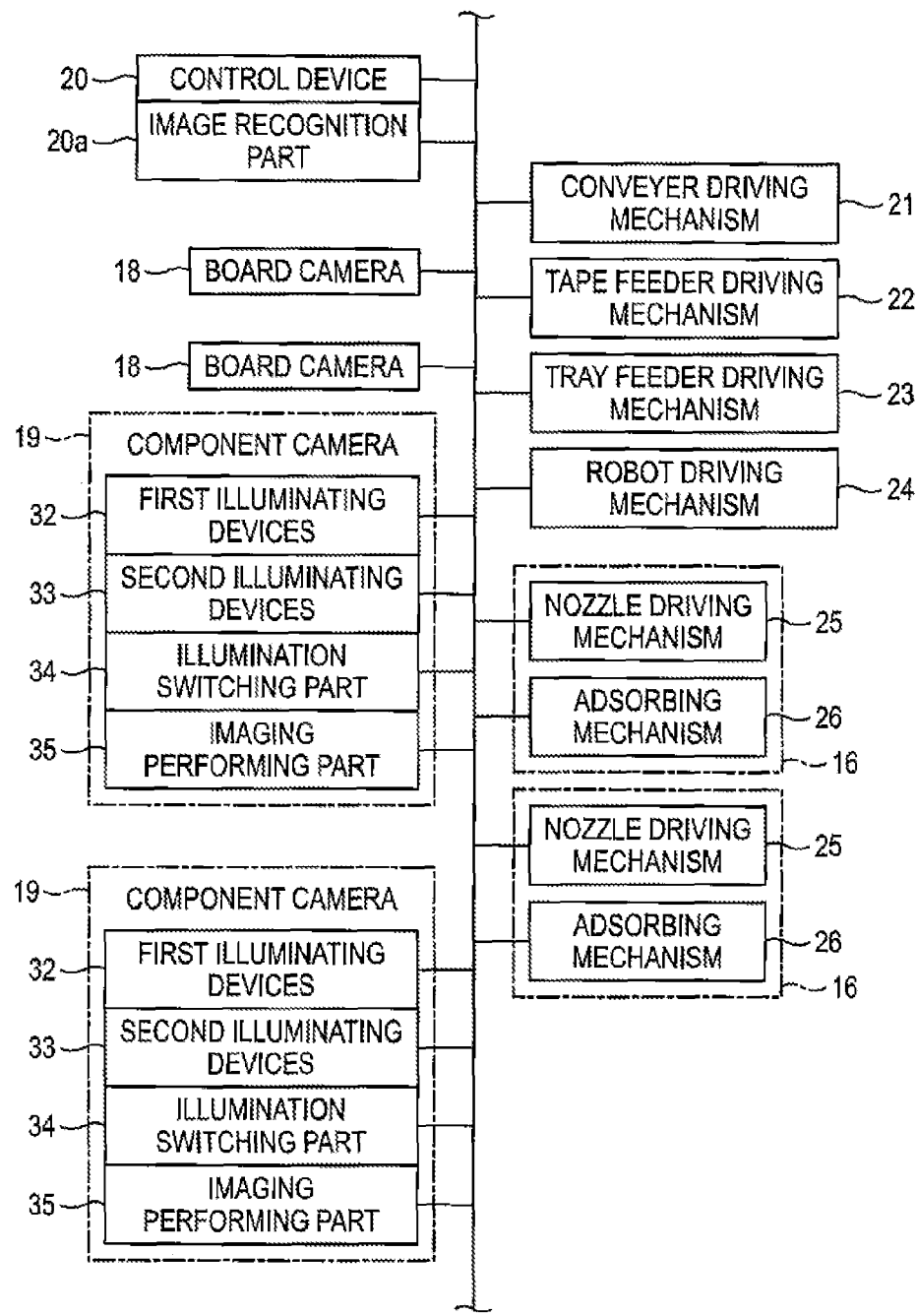
FIG. 4 is a block diagram which shows a control system of the component mounting device in the embodiment of the present invention.

The control device 20 controls the imaging operation of each of the board cameras 18 and the imaging operation of each of the component cameras 19 (FIG. 4). Image data obtained by the imaging action of each of the board cameras 18 and image data obtained by the imaging action of each of the component cameras 19 are respectively sent to the control device 20, and are processed to be recognized in an image recognition part 20a (FIG. 4) which the control device 20 includes.

Figure 5:
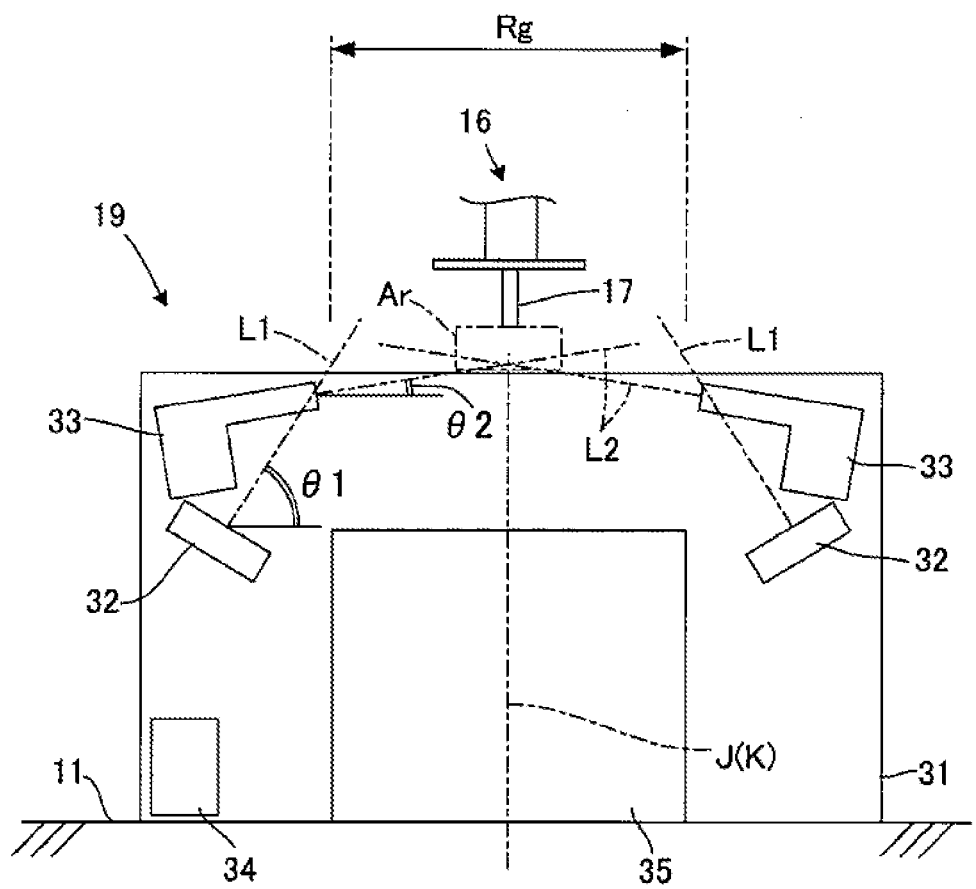
FIG. 5 is a side view of a component camera which the component mounting device in the embodiment of the present invention includes.
Figure 6:
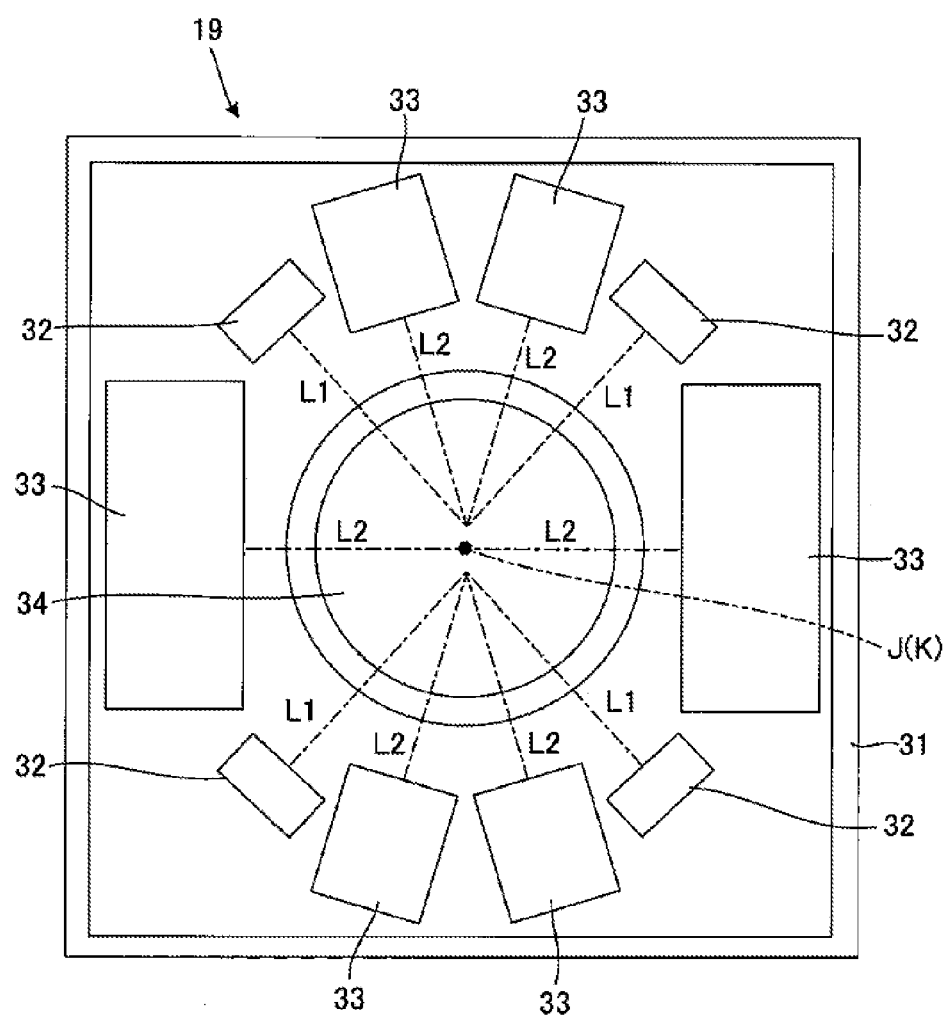
FIG. 6 is a plan view of the component camera in the embodiment of the present invention.

The embodiment is characterized in the structure of the component cameras 19, which is described as follows. As shown in FIGS. 5 and 6, each of the component cameras 19 includes a housing 31 which is provided on the base 11, first illuminating devices 32, second illuminating devices 33, an illumination switching part 34 and an imaging performing part 35 which are provided inside the housing 31.

In FIGS. 5 and 6, the first illuminating devices 32 are provided to be a plurality of (here, four) devices to surround a vertical central axis J of the housing 31.

Figure 7:
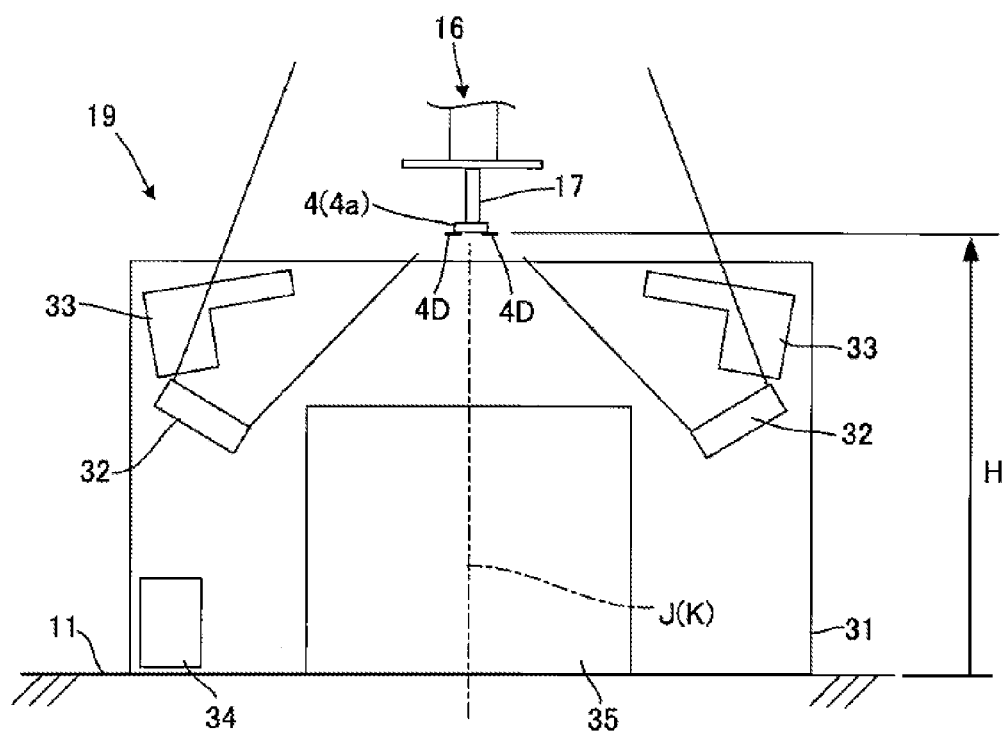
FIG. 7 is a side view of the component camera in the embodiment of the present invention.

Each of the first illuminating devices 32 irradiates light obliquely from below (referring to an optical axis L1 of the first illuminating devices 32), to the component 4 which is located above the component camera 19 and in the imaging field of vision Rg of the component camera 19. The light irradiated from each of the first illuminating devices 32 includes a scattered light so that it is possible to illuminate a wide area. The light irradiated from the first illuminating devices 32 illuminates the bottom surface of the component 4 which is located in the imaging field of vision Rg of the component camera 19 from below (FIG. 7).

In FIGS. 5 and 6, the second illuminating devices 33 are provided to be a plurality of (here, six) devices to surround the vertical central axis J of the housing 31.

Figure 8:
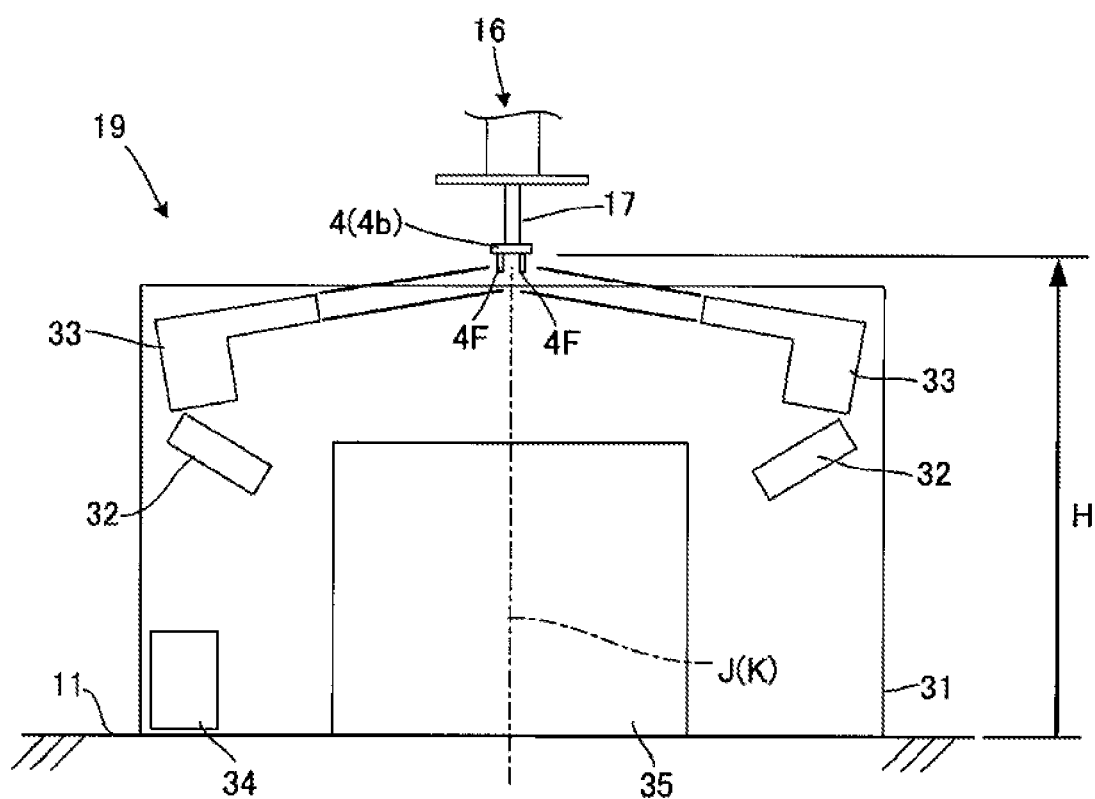
FIG. 8 is a side view of the component camera in the embodiment of the present invention.

Each the second illuminating devices 33 irradiates light at an angle θ2 (FIG. 5) which is closer to a horizontal irradiation direction (irradiation towards a horizontal direction) than an irradiation angle θ1 (FIG. 5) of the light of each of the first illuminating devices 32 (referring to an optical axis L2 of the second illuminating devices 33) to the component 4 which is located in the imaging field of vision Rg above the component camera 19. The light irradiated from each of the second illuminating devices 33 includes a parallel light or a convergent light so that it is possible to locally illuminate. When the component 4 which is located in the imaging field of vision Rg of the component camera 19 is a through hole component 4b, the light irradiated from each of the second illuminating devices 33 only illuminates the downwards extending parts 4F (particularly the bottom ends of the downwards extending parts 4F) which the through hole component 4b includes (FIG. 8).

As shown in FIG. 5, the second illuminating devices 33 are provided in the housing 31 at positions that are higher than those of the first illuminating devices 32 (however, the positions would not block the light from the first illuminating devices 32). Therefore, the whole component camera 19 has a compact structure that the whole component camera 19 would not spread too much laterally.

The illumination switching part 34 switches between that the component 4 is illuminated by the first illuminating device 32 and that the component 4 is illuminated by the second illuminating devices 33, based on instructions from the control device 20. The control device 20 determines whether the component 4 which is adsorbed by the adsorbing nozzle 17 is a surface mounted component 4a or a through hole component 4b, based on the content of a mounting program in which procedures of component mounting operations are recorded. The control device 20 outputs to the illumination switching part 34 an instruction that makes the first illuminating devices 32 to be turned on when the component 4 which is adsorbed by the adsorbing nozzle 17 is a surface mounted component 4a, and outputs to the illumination switching part 34 an instruction that makes the second illuminating devices 33 to be turned on when the component 4 which is adsorbed by the adsorbing nozzle 17 is a through hole component 4b.

The imaging performing part 35 has imaging elements which are formed by line sensors which are not shown in the figure. The imaging performing part 35 is provided in the housing 31 so that the imaging optical axis K corresponds to the vertical central axis J of the housing 31. The imaging performing part 35 is controlled by the control device 20, and performs the imaging of the component 4 which is illuminated by the first illuminating devices 32 or the second illuminating devices 33 (FIG. 4).

In this way, the illumination switching part 34 functions as an illumination switching unit which switches between that the component 4 is illuminated by the first illuminating devices 32 and that the component 4 is illuminated by the second illuminating devices 33 based on whether the component 4 adsorbed by the adsorbing nozzle 17, namely, the component 4 which is located in the imaging field of vision Rg of the component camera 19 as an imaging object, is a surface mounted component 4a or a through hole component 4. The imaging performing part 35 functions as an imaging performing unit which performs the imaging of the component 4 which is illuminated by the first illuminating devices 32 or the second illuminating devices 33.

The component camera 19 that has the above structure, besides the first illuminating devices 32 which illuminate the bottom surface of the surface mounted component 4a by irradiating light obliquely from below to the surface mounted component 4a located in the imaging field of vision Rg, further includes the second illuminating devices 33 which irradiate light at an irradiation angle that is closer to a horizontal direction irradiation than the irradiation angle of the light of the first illuminating devices 32 (as shown in FIG. 5, smaller than the irradiation angle of the light of the first illuminating devices 32, not the horizontal direction irradiation) as an illuminating unit to only illuminate the downwards extending parts 4F of the through hole component 4b located in the imaging field of vision Rg. For the component camera 19, both when the component 4 is illuminated by the first illuminating devices 32 and when the component 4 is illuminated by the second illuminating devices 33, the imaging region Ar of the component 4 where the component camera 19 images (FIG. 5) can be set to be located above the component camera 19. In other words, both when the component 4 is a surface mounted component 4a and when the component 4 is a through hole component 4b, the imaging region Ar of the component 4 where the component camera 19 images (FIG. 5) can be set to be located above the component camera 19. Therefore, irrespective of whether the component 4 which is adsorbed by the adsorbing nozzle 17 is a surface mounted component 4a or a through hole component 4b, the component camera 19 can image the component 4 at the same imaging height H in imaging field of vision Rg (FIGS. 7 and 8).

Figure 9:
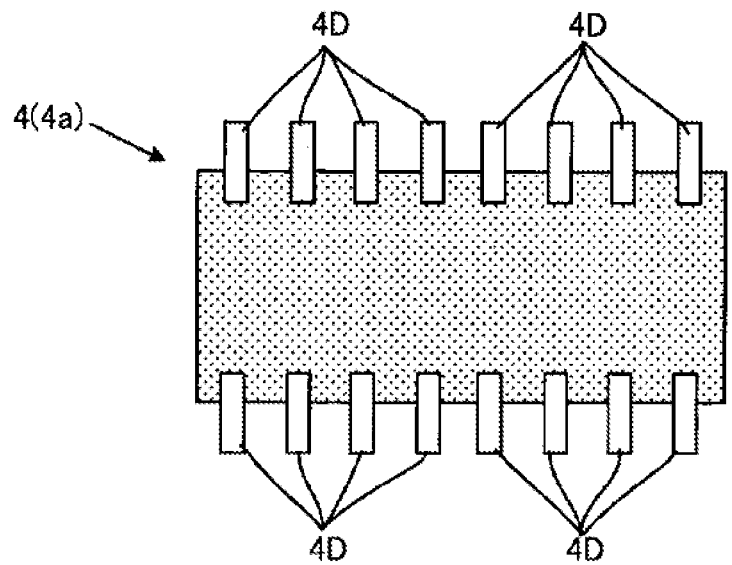
FIGS. 9 (a) and (b) are figures which show an example of image data of a surface mounted component imaged by the component camera in the embodiment of the present invention.
Figure 9:
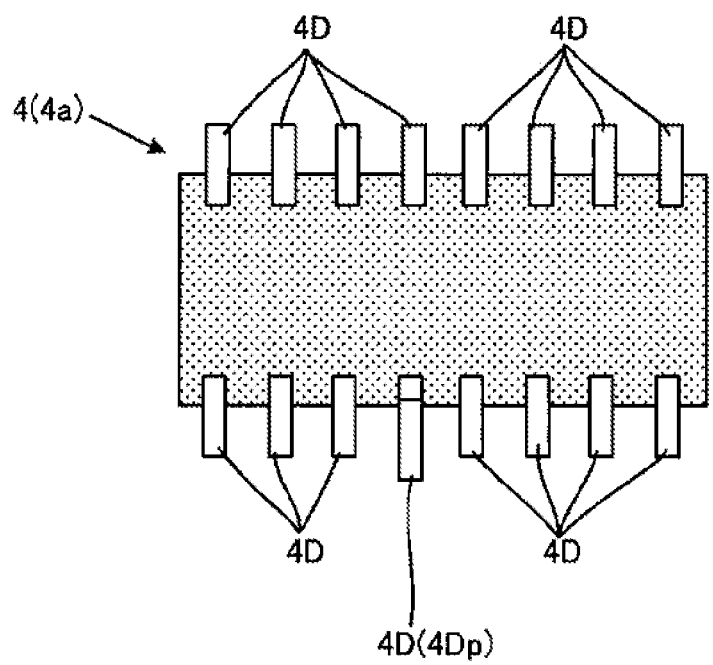

When the imaging of the surface mounted component 4a whose bottom surface is illuminated by the first illuminating devices 32 is performed by the imaging performing part 35, images such as those in FIGS. 9 (a) and (b), in which the respective electrode parts 4D look brighter than the bottom surface of the surface mounted component 4a, are obtained. The control device 20 can recognize the positions of the electrode parts 4D which the surface mounted component 4a includes based on the images, and therefore the posture of the surface mounted component 4a can be grasped.

Figure 10:
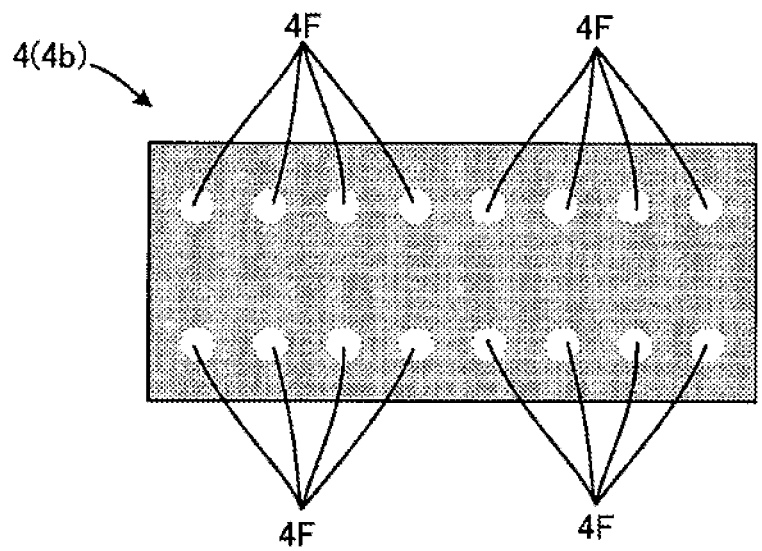
FIGS. 10 (a) and (b) are figures which show an example of image data of a through hole component imaged by the component camera in the embodiment of the present invention.
Figure 10:
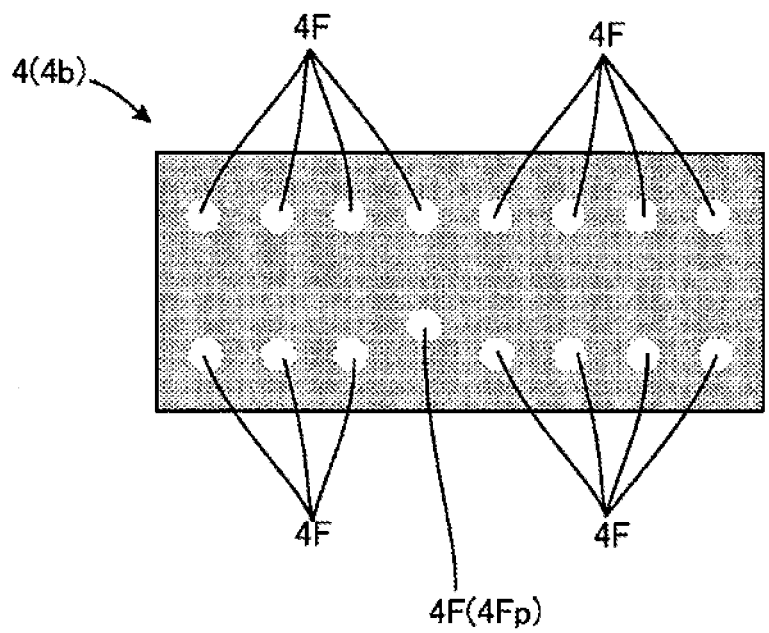

When the imaging of the through hole component 4b only whose downwards extending parts 4F are illuminated by the second illuminating devices 33 is performed by the imaging performing part 35, images such as those in FIGS. 10 (a) and (b), in which it is seen that because light does not hit the bottom surface of the through hole component 4b, the bottom surface of the through hole component 4b is dark, and only the bottom ends of the downwards extending parts 4F which light hits are bright, are obtained. The control device 20 can recognize the positions of the downwards extending parts 4F which the through hole component 4b includes based on the images, and therefore the posture of the through hole component 4b can be grasped.

Based on the image of the component 4 that is obtained by the imaging action of the imaging performing part 35 as described above, the control device 20 grasps the posture of the component 4 and determines whether or not an abnormal point is recognized in the component 4. Here, if, for example, a curve or a defect is recognized at the electrode parts 4D of the surface mounted component 4a, or for example, a curve or a defect is recognized at the downwards extending parts 4F of the through hole component 4b, then an abnormal point of the component 4 is recognized, FIG. 9 (a) is an example of the image when no curve is produced in all of the 16 electrode parts 4D which the surface mounted component 4a includes, and all the electrode parts 4D line up orderly. In this case, the control device 20 determines that an abnormal point is not recognized in the surface mounted component 4a. FIG. 9 (b) is an example of the image when a curve has been produced in one of the 16 electrode parts 4D (shown as 4Dp) and the electrode part 4Dp where the curve has been produced does no line up with the other electrode parts 4D. In this case, the control device 20 determines that an abnormal point is recognized in the surface mounted component 4a.

FIG. 10 (a) is an example of the image when no curve is produced in all of the 16 downwards extending parts 4F which the through hole component 4b includes, and all the downwards extending parts 4F line up orderly. In this case, the control device 20 determines that an abnormal point is not recognized in the through hole component 4b. FIG. 10 (b) is an example of the image when a curve has been produced in one of the 16 downwards extending parts 4F (shown as 4Fp) and the downwards extending part 4Fp where the curve has been produced does no line up with the other downwards extending parts 4F. In this case, the control device 20 determines that an abnormal point is recognized in the through hole component 4b.

Then a result is obtained that the presence or absence of an abnormal point in the component 4 adsorbed by the adsorbing nozzle 17 is determined. When an abnormal point is not recognized in the component 4, based on the grasped posture of the component 4, the control device 20 makes the adsorbing nozzle 17 (the mounting head 16) to move so that the component 4 adsorbed by the adsorbing nozzle 17 is mounted precisely on the component mounting site on the board 2 that is positioned by the conveyor 12. On the other hand, when an abnormal point is recognized in the component 4 adsorbed by the adsorbing nozzle 17, the control device 20 discards the component 4 without mounting on the board 2.

Figure 11:
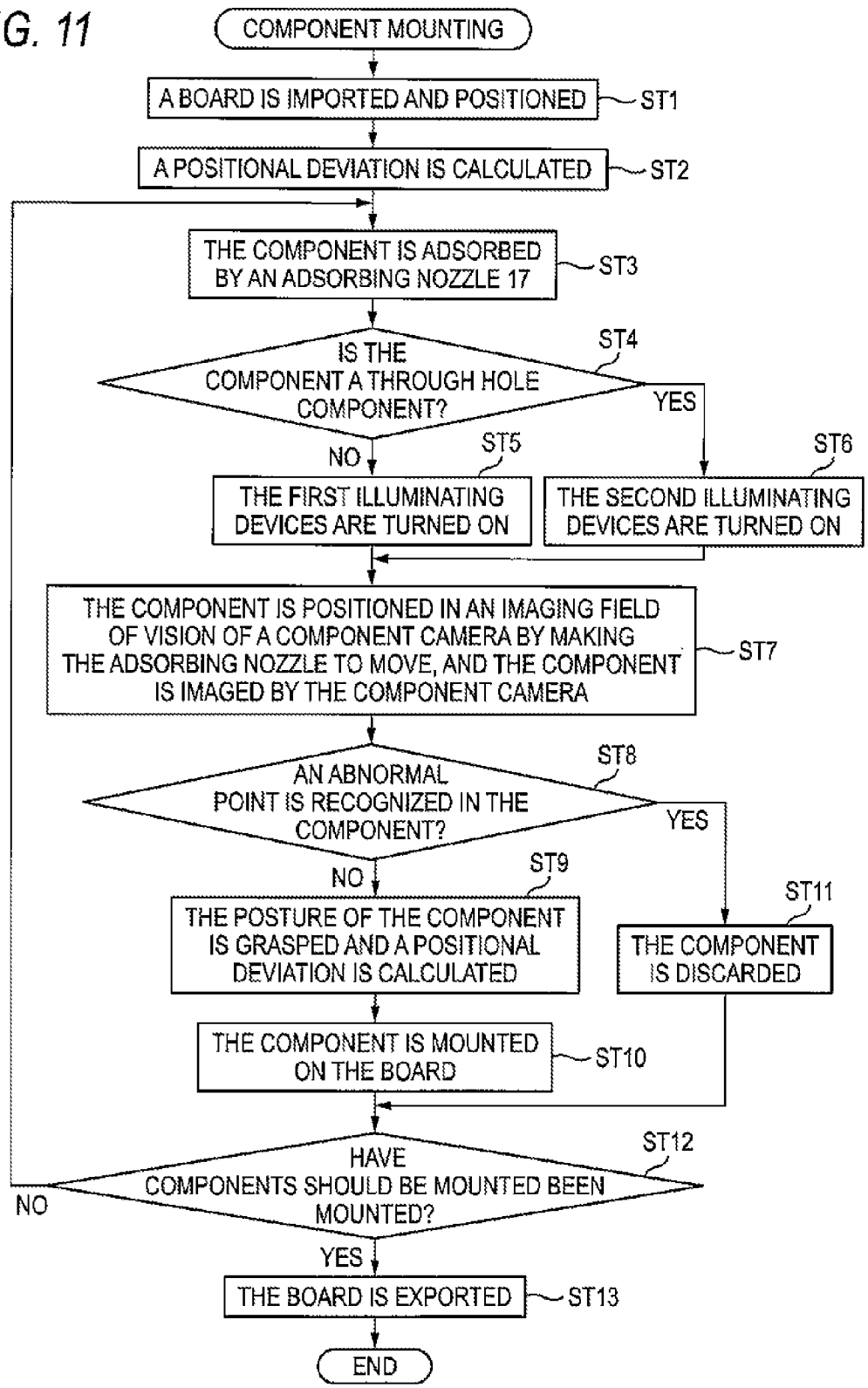
FIG. 11 is a flow chart which shows the order of component mounting procedures that the component mounting device in the embodiment of the present invention performs.

In the component mounting operations performed by the component mounting device 1 having the above structure, first, the control device 20 makes the board 2, which has been sent from other devices (for example, a solder printing machine) placed in the upstream of the component mounting device, to be positioned at a predetermined operation position by being imported by the conveyor 121 (step ST1 shown in FIG. 11). The board camera 18 (the mounting head 16) is made to moved to be above the board 2 by actuating the head moving robot 15, an image recognition is performed by making the board camera 18 to image a board mark on the board 2, and a positional deviation from a normal operation position of the board 2 is calculated (step ST2 shown in FIG. 11).

After the positional deviation of the board 2 is calculated, the control device 20 makes the mounting head 16 to move to be above the tape feeder 13 by actuating the head moving robot 15, and makes the adsorbing nozzle 17 to touch the component 4 supplied at the component supply ports 13p of the tape feeder 13. At the same time, a vacuum pressure is supplied to the adsorbing nozzle 17 by performing operation control of the adsorbing mechanism 26, and the component 4 is adsorbed and picked up by the adsorbing nozzle 17 (step ST3 shown in FIG. 11).

The control device 20 determines whether or not the component 4 which the adsorbing nozzle 17 adsorbs currently is a through hole component 4b from the content of the mounting program (step ST4 shown in FIG. 11). When the component 4 which the adsorbing nozzle 17 adsorbs currently is not a through hole component 4b (a surface mounted component 4a), the first illuminating devices 32 are turned on (step ST5 shown in FIG. 11), and when the component 4 which the adsorbing nozzle 17 adsorbs currently is a through hole component 4b, the second illuminating devices 33 are turned on (step ST6 shown in FIG. 11).

Thus, the steps ST4 to ST6 are procedures for changing between that the component 4 which the adsorbing nozzle 17 adsorbs is illuminated by the first illuminating devices 32 and that the component 4 is illuminated by the second illuminating devices 33 based on whether the component 4 is a surface mounted component 4a or a through hole component 4b.

After the first illuminating devices 32 or the second illuminating devices 33 are turned on based on whether the component 4 which the adsorbing nozzle 17 adsorbs currently is a through hole component 4b or not, the control device 20 makes the component 4 to be located in the imaging field of vision Rg of the component camera 19 by making the adsorbing nozzle 17 (the mounting head 16) move, and the component 4 is imaged by the component camera 19 from below (step ST7 shown in FIG. 11).

The component 4 can be imaged while a scanning action is performed to move the adsorbing nozzle 17 (mounting head 16) horizontally so that the component 4 crosses over the component camera 19 horizontally. Conventionally, once the movement of the adsorbing nozzle 17 stops above the component camera 19, the adsorbing nozzle 17 is made to drop, an expensive area sensor has to be used in the imaging performing part 35. However, in the present embodiment, in the component camera 19, because a line sensor can be used for the imaging performing part 35 in view of the above scanning action, cost can be saved.

After the component 4 is imaged by the component camera 19, the control device 20 determines whether or not an abnormal point is recognized in the component 4 by performing the image recognition of the image data of the component 4 obtained in the imaging (step ST8 shown in FIG. 11). As a result, when an abnormal point is not recognized in the component 4, the control device 20 grasps the posture of the component 4 relative to the adsorbing nozzle 17 and calculates a positional deviation (adsorption deviation) from the adsorbing nozzle 17 (step ST9 shown in FIG. 11). The control device 20 makes the adsorbing nozzle 17 (the mounting head 16) move to be above the board 2, makes the component 4, which is adsorbed by the adsorbing nozzle 17 by controlling that operation of the nozzle driving mechanism 25, contact with a target mounting site (solder is printed on the electrode 3 at the target mounting site by a solder printing machine placed in the upstream of the component mounting device 1) on the board 2 which is positioned by the conveyor 12, releases the supply of the vacuum pressure to the adsorbing nozzle 17 by performing an operation control of the adsorbing mechanism 26, and mounts the component 4 on the board 2 (step ST10 shown in FIG. 11).

Here, when the component 4 is mounted on the board 2, the control device 20, after having considered the posture of the component 4 grasped in the step ST9, performs position revision (including rotary revision) of the adsorbing nozzle 17 to cancel the positional deviation of the board 2 obtained when the board mark is imaged by the board camera 18 and the positional deviation (adsorption deviation) of the component 4 from the adsorbing nozzle 17 obtained when the component 4 is imaged by the component camera 19.

Thus, the control device 20 becomes a mounting control unit which, after the component 4 is imaged by the component camera 19 which is an imaging device, grasps the posture of the component 4 based on the image obtained by the imaging, and makes the component 4 to be mounted on the board 2 positioned by the conveyor 12 based on the grasped posture. Further, the step ST9 and the step ST10 become procedures which grasp the posture of the component 4 based on the image provided by the imaging of the component camera 19 in the step ST7, and make the component 4 to be mounted on the board 2 positioned by the conveyor 12 based on the grasped posture.

On the other hand, when an abnormal point is recognized in the component 4 in step ST8, the control device 20 discards the component 4 adsorbed by the adsorbing nozzle 17 to a predetermined component discarding position (not shown in the figure) (step ST11 shown in FIG. 11).

After the step ST10 or the step ST11 finishes, the control device 20 determines whether or not all components 4 that should be mounted on the board 2 has been mounted on the board 2 (step ST12 shown in FIG. 11). When all components 4 that should be mounted on the board 2 has not been mounted on the board 2, the procedures return to the step ST3 and the next component 4 is picked up, and when all components 4 that should be mounted on the board 2 has been mounted on the board 2, the conveyor 12 is actuated and the board 2 is exported to other devices (for example, a post-mounting inspection machine) which is placed in the downstream of the component mounting device 1 (step ST13 shown in FIG. 11).

As described above, the component camera 19 which is included in the component mounting device 1 includes the first illuminating devices 32 as a first illuminating unit to illuminate the bottom surface of the component 4 (surface mounted component 4a) by irradiating light to the component 4 obliquely from below, when the component 4 which is adsorbed by the adsorbing nozzle 17 and is located in the imaging field of vision Rg is a surface mounted component 4a which is to be surface mounted on the surface of the board 2, the second illuminating devices 33 as a second illuminating unit to only illuminate the downwards extending parts 4F of the component 4 (through hole component 4b) by irradiating light to the component 4 at an irradiation angle which is closer to a horizontal direction irradiation than the irradiation angle of the light of the first illuminating devices 32 (not horizontal direction irradiation, but smaller than the irradiation angle of the light of the first illuminating devices 32), when the component 4 which is adsorbed by the adsorbing nozzle 17 and is located in the imaging field of vision Rg is a through hole component 4b which has downwards extending parts 4F that extend downward, the illumination switching part 34 as an illumination switching unit that switches between that the component 4 is illuminated by the first illuminating devices 32 and that the component 4 is illuminated by the second illuminating devices 33 based on whether the component 4 which is adsorbed by the adsorbing nozzle 17 is a surface mounted component 4a or a through hole component 4b, and the imaging performing part 35 as an imaging performing unit which images the component 4 which is illuminated by the first illuminating devices 32 or the second illuminating devices 33.

Further, the imaging method of the component camera 19 includes procedures (step ST4-step ST6) that switch between that the component 4 is illuminated by the first illuminating devices 32 and that the component 4 is illuminated by the second illuminating devices 33 based on whether the component 4 which is adsorbed by the adsorbing nozzle 17 is a surface mounted component 4a or a through hole component 4b and a procedure (step ST7) in which the component 4 illuminated by the first illuminating devices 32 or the second illuminating devices 33 is imaged.

For the component camera 19 and the imaging method thereof in the present embodiment, as described above, both when the component 4 is illuminated by the first illuminating devices 32 and when the component 4 is illuminated by the second illuminating devices 33, the imaging region Ar of the component 4 can be set to be located above the component camera 19. Further, for the component camera 19 and the imaging method thereof in the present embodiment, irrespective of whether the component 4 which is adsorbed by the adsorbing nozzle 17 is a surface mounted component 4a or a through hole component 4b, the component 4 can be imaged at the same imaging height H in the imaging field of vision Rg. Therefore, in the component camera 19 and imaging method thereof in the present invention, when the component 4 which is adsorbed is located in the field of vision of the component camera 19, it is not necessary to make the adsorbing nozzle 17 drop once the horizontal movement of the adsorbing nozzle 17 stops as before. The time required for the imaging of the through hole component 4b is shortened and the increase of the mounting tact of the component mounting device can be prevented.

Further, for the component camera 19 and the imaging method thereof in the present embodiment, the first illuminating devices 32 used when the surface mounted component 4a is imaged and the second illuminating devices 33 used when the through hole component 4b is imaged can be provided side by side, and the through hole component 4b can be imaged at the same imaging height H as that at which the surface mounted component 4a is imaged. Therefore, for the component camera 19 and the imaging method thereof in the present embodiment, irrespective of whether the component 4 is a surface mounted component 4a or a through hole component 4b, the operation of the adsorbing nozzle 17 when the component 4 is imaged can be performed constantly.

In the imaging device (the component camera 19) and the imaging method in the present embodiment, components (for example, BGA) of the type that has downwards extending parts (bumps) as well as surface mounted components can be imaged when light is irradiated by both of the first illuminating devices 32 and the second illuminating devices 33.

Although the present invention is described in detail with reference to specific embodiments, it is apparent that various modifications and amendments may be made by those skilled in the art without departing from the spirit and scope of the invention.

This application is based on the Japanese patent application (patent application 2011-044644) filed on Mar. 2, 2011 and the Japanese patent application (patent application 2011-044645) filed on Mar. 2, 2011, whose contents are incorporated herein by reference.

INDUSTRIAL APPLICABILITY

A component mounting device, a component mounting method, an imaging device and an imaging method are provided so that the imaging of through hole components can be performed in a short time and the increase of the mounting tact of the component mounting device can be prevented.

DESCRIPTION OF THE SYMBOLS 1 component mounting device
2 board
3 electrode
4 component
4a surface mounted component
4b through hole component
4D, 4Dp electrode part
4F, 4Fp downwards extending part
11 base
12 conveyor (board positioning unit)
13 tape feeder (component supplying unit)
13C carriage
13p component supply port
14 tray feeder (component supplying unit)
14t tray
15 head moving robot
15a Y axis table
15b X axis table
16 mounting head
17 adsorbing nozzle
18 board camera
19 component camera (imaging device)
20 control device (illumination switching unit)
20a image recognition part
21 conveyor driving mechanism
22 tape feeder driving mechanism
23 tray feeder driving mechanism
24 robot driving mechanism
25 nozzle driving mechanism
26 adsorbing mechanism
31 housing
32 first illuminating devices (first illuminating unit)
33 second illuminating devices (second illuminating unit)
34 illumination switching part (illumination switching unit)
35 imaging performing part (imaging performing unit)
A arrow
Ar imaging region
J vertical central axis
K imaging optical axis
L1, L2 optical axis
OP operator
Rg imaging field of vision
H imaging height

The invention claimed is:

1. A component mounting device, comprising
a board positioning unit which positions a board,
a component supplying unit which supplies a component,
an adsorbing nozzle which adsorbs the component supplied from the component supplying unit,
an imaging unit which, when the component which is adsorbed by the adsorbing nozzle and is moved into an imaging field of vision is a surface mounted component which is to be surface mounted on the surface of the board, images the surface mounted component from below by illuminating the bottom surface of the surface mounted component with a first illuminating unit which irradiates light obliquely from below to the surface mounted component, and when the component which is adsorbed by the adsorbing nozzle and is moved into the imaging field of vision is an insertion component which has downwards extending parts that extend downwards, images the insertion component from below by only illuminating the downwards extending parts with a second illuminating unit which irradiates light at an irradiation angle which is closer to a horizontal direction irradiation than the irradiation angle of the light of the first illuminating unit to the insertion component, the second illuminating unit being provided at a position higher than the first illuminating unit, and
a mounting control unit which, after the component is imaged by the imaging unit, grasps a posture of the component based on an image obtained through the imaging, and mounts the component on the board which is positioned by the board positioning unit based on the grasped posture.

2. A component mounting method of a component mounting device which comprises a board positioning unit which positions a board, a component supplying unit which supplies a component, an adsorbing nozzle which adsorbs the component supplied from the component supplying unit, and an imaging unit which images the component from below, wherein the component mounting method comprises
a procedure in which the imaging unit, when the component which is adsorbed by the adsorbing nozzle and is moved into an imaging field of vision of the imaging unit is a surface mounted component which is to be surface mounted on the surface of the board, imaging the surface mounted component from below by illuminating the bottom surface of the surface mounted component with a first illuminating unit which irradiates light obliquely from below to the surface mounted component, and when the component which is adsorbed by the adsorbing nozzle and is moved into the imaging field of vision of the imaging unit is an insertion component which has downwards extending parts that extend downwards, images the insertion component from below by only illuminating the downwards extending parts with a second illuminating unit which irradiates light at an irradiation angle which is closer to a horizontal direction irradiation than the irradiation angle of the light of the first illuminating unit to the insertion component, the second illuminating unit being provided at a position higher than the first illuminating unit, and a procedure in which a posture of the component is grasped based on an image obtained after the imaging unit images the component, and the component is mounted on the board which is positioned by the board positioning unit based on the grasped posture.

3. The imaging device according to claim 1, wherein the irradiation angle of the light of the second illuminating unit excludes a horizontal direction irradiation.

4. The imaging method according to claim 2, wherein the irradiation angle of the light of the second illuminating unit excludes a horizontal direction irradiation.

5. The imaging device according to claim 1, wherein the irradiation of the light of the second illuminating unit is not the horizontal direction irradiation.

6. The imaging method according to claim 2, wherein the irradiation of the light of the second illuminating unit is not the horizontal direction irradiation.

* * * * *